(12) United States Patent
Shimura et al.

(10) Patent No.: US 10,126,373 B2
(45) Date of Patent: Nov. 13, 2018

(54) INSPECTION METHOD OF SECONDARY BATTERY

(71) Applicant: TOYOTA JIDOSHA KABUSHIKI KAISHA, Toyota-shi, Aichi-ken (JP)

(72) Inventors: Yosuke Shimura, Toyota (JP); Tomohide Sumi, Nagoya (JP); Yoshio Matsuyama, Nisshin (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 237 days.

(21) Appl. No.: 15/053,525

(22) Filed: Feb. 25, 2016

(65) Prior Publication Data
US 2016/0252586 A1    Sep. 1, 2016

(30) Foreign Application Priority Data

Feb. 27, 2015 (JP) ................................. 2015-038672
Feb. 27, 2015 (JP) ................................. 2015-039177

(51) Int. Cl.
G01R 19/165 (2006.01)
H01M 10/44 (2006.01)
G01R 31/36 (2006.01)

(52) U.S. Cl.
CPC ... G01R 31/3675 (2013.01); G01R 19/16542 (2013.01); G01R 31/3637 (2013.01); G01R 31/3641 (2013.01); G01R 31/3648 (2013.01); G01R 31/3662 (2013.01); H01M 10/446 (2013.01)

(58) Field of Classification Search
CPC .......... G01R 19/16542; G01R 31/3637; G01R 31/3641; G01R 31/3648; G01R 31/3662; G01R 31/3675; H01M 10/44; H01M 10/446; H01M 10/448
See application file for complete search history.

(56) References Cited

U.S. PATENT DOCUMENTS

| 2014/0028320 | A1 | 1/2014 | Nakamura |
| 2015/0162645 | A1* | 6/2015 | Kobayashi .......... H01M 2/1673 29/623.5 |
| 2015/0212162 | A1 | 7/2015 | Nakayama et al. |
| 2016/0161564 | A1* | 6/2016 | Kurihara ............ G01R 31/3606 324/426 |

(Continued)

FOREIGN PATENT DOCUMENTS

| JP | 2002199608 A | 7/2002 |
| JP | 2013-084508 A | 5/2013 |
| JP | 2014-025858 A | 2/2014 |

(Continued)

Primary Examiner — Stephen W Smoot
(74) Attorney, Agent, or Firm — Sughrue Mion, PLLC

(57) ABSTRACT

An inspection method of a secondary battery according to the present invention includes: a charging step of charging an inspection target cell to a predetermined voltage set in advance; a voltage drop amount calculation step of calculating an amount of a voltage drop due to discharge by discharging the inspection target cell at a voltage of not more than the predetermined voltage; a non-defective product determination step of determining that the inspection target cell is a non-defective product, when the voltage drop amount is a threshold or less; and an aging step of performing aging after the non-defective product determination step.

6 Claims, 15 Drawing Sheets

(56) References Cited

U.S. PATENT DOCUMENTS

2016/0268648 A1* 9/2016 Ueno .................. H01M 4/131

FOREIGN PATENT DOCUMENTS

| JP | 2014185927 A | 10/2014 |
|---|---|---|
| JP | 2015008106 A | 1/2015 |
| WO | 2013061754 A1 | 5/2013 |
| WO | 2014016956 A1 | 1/2014 |

* cited by examiner

INSPECTION METHOD OF SECONDARY BATTERY

INCORPORATION BY REFERENCE

The disclosure of Japanese Patent Application No. 2015-038672 and 2015-039177 filed on Feb. 27, 2015 including the specification, drawings and abstract is incorporated herein by reference in its entirety.

BACKGROUND OF THE INVENTION

1. Field of the Invention

The present invention relates to an inspection method of a secondary battery, and relates to, for example, an inspection method of a secondary battery, the inspection method including a low-temperature output inspection to guarantee a low-temperature output.

2. Description of Related Art

In an inspection step of a secondary battery, there is a low-temperature output inspection to guarantee an output capability in a case where the secondary battery is put under a low-temperature environment. Japanese Patent Application Publication No. 2013-084508 (JP 2013-084508 A) includes a step of setting a state of charge (SOC) of a secondary battery to 3% to 15%, and a step of measuring a resistance of the secondary battery having a SOC of 3% to 15%, under an environment of 10° C. to 30° C. Further, in the technique described in JP 2013-084508 A, a measurement step is performed after an aging step, and a low-temperature output inspection is performed based on a result of the measurement in the measurement step.

However, in a case where the low-temperature output inspection is performed after the aging step, the low-temperature output inspection is performed based on a voltage drop amount after a formation reaction of a SEI coating is completed. Therefore, a measured resistance (e.g., a reaction resistance) of the secondary battery is small, which causes a problem that measurement accuracy cannot be secured sufficiently. Further, in a case where aging is performed after the inspection step, battery performance changes due to aging, which may decrease a correlation between the measured voltage drop amount and a low-temperature output.

SUMMARY OF THE INVENTION

The present invention improves accuracy of a low-temperature output inspection.

One aspect of the present invention relates to an inspection method of a secondary battery, and the inspection method includes: a charging step of charging an inspection target cell to a predetermined voltage set in advance; a voltage drop amount calculation step of calculating an amount of a voltage drop due to discharge by discharging the inspection target cell at a voltage of not more than the predetermined voltage; a non-defective product determination step of determining that the inspection target cell is a non-defective product, when the voltage drop amount is a threshold or less; and an aging step of performing aging after the non-defective product determination step.

In the inspection method of the secondary battery according to the present invention, the voltage drop amount at the time when the secondary battery is discharged is measured before the aging step is performed, and a low-temperature output inspection is performed based on a result of the measurement. Hereby, in the inspection method of the secondary battery according to the present invention, since the low-temperature output inspection is performed based on the voltage drop amount obtained before a formation reaction of a SEI coating is completed, a reaction resistance to be measured is large, thereby making it possible to have a high correlation between the reaction resistance and the low-temperature output of the secondary battery.

According to the inspection method of the secondary battery according to the present invention, it is possible to improve measurement accuracy of the low-temperature output inspection.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

With reference to drawings, the following describes embodiments of the present invention. The following description and drawings are omitted or simplified as appropriate for clarification of the description. In each of the drawings, the same element has the same reference sign, and a redundant description is omitted as needed.

In an inspection method of a secondary battery according to First Embodiment, a secondary battery as an inspection target is a lithium ion battery, for example. In view of this, the following description is made on the premise that the secondary battery to be inspected is a lithium ion battery.

Figure 1:
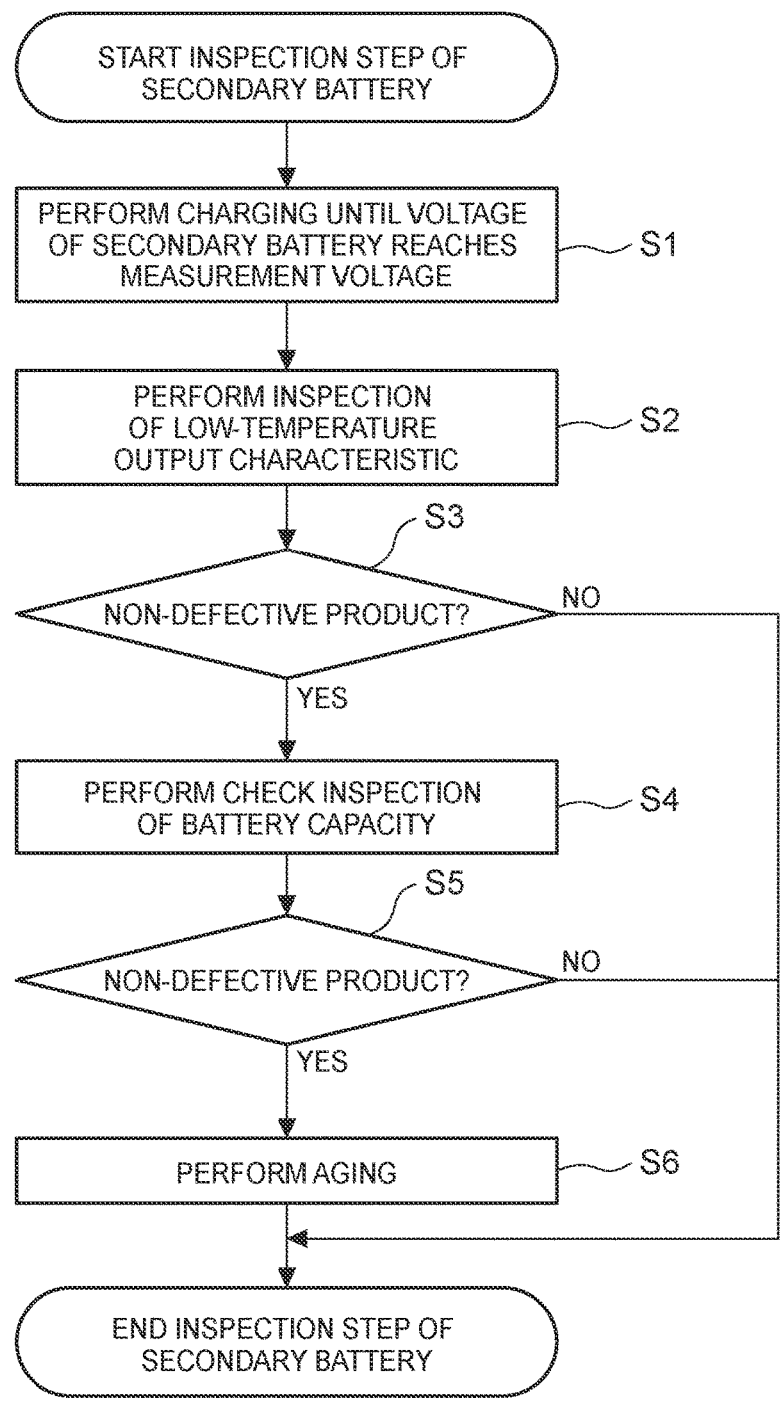
FIG. 1 is a flowchart of an inspection method of a secondary battery according to First Embodiment.

FIG. 1 illustrates a flowchart of the inspection method of the secondary battery according to First Embodiment. As illustrated in FIG. 1, in the inspection method of the secondary battery according to First Embodiment, a charging step S1 is performed first such that, until a voltage of an inspection target cell (e.g., a secondary battery) reaches a predetermined voltage set in advance (referred to as a measurement voltage in the following description), the secondary battery is charged. The measurement voltage is determined based on a voltage of the secondary battery at which a correlation coefficient between a low-temperature output of the secondary battery and a voltage drop amount in the after-mentioned low-temperature output characteristic inspection step S2 is 0.8 or more, or a state of charge of the secondary battery at which the correlation coefficient between the low-temperature output of the secondary battery and the voltage drop amount in the low-temperature output characteristic inspection step S2 is 0.7 or more.

Then, in the inspection method of the secondary battery according to First Embodiment, the low-temperature output characteristic inspection step S2 of inspecting a low-temperature output characteristic is performed. The low-temperature output characteristic inspection step S2 initially includes a voltage drop amount calculation step of calculating an amount of a voltage drop due to discharge by discharging the secondary battery at a voltage of not more than the measurement voltage. Further, in a discharge step in the low-temperature output characteristic inspection step S2, the discharge is performed at a constant current. In the low-temperature output characteristic inspection step S2, a reaction resistance of the secondary battery can be calculated based on a magnitude of the constant current used for the discharge and the amount of the voltage drop due to the discharge. However, in the inspection method of the secondary battery according to First Embodiment, since the magnitude of the constant current used for the discharge is determined in advance, the after-mentioned non-defective product determination is performed only by use of the voltage drop amount.

Subsequently, in the inspection method of the secondary battery according to First Embodiment, when the voltage drop amount is a threshold or less, a non-defective product determination step S3 of determining that the secondary battery is a non-defective product is performed. Since the voltage drop amount is the threshold or less, it is considered that a reaction resistance of the secondary battery is sufficiently small and the secondary battery does not have a problem with a low-temperature output capability. When it is determined that the secondary battery as the inspection target is a defective product in the non-defective product determination step S3, the inspection step is finished at that point. In the meantime, when it is determined that the secondary battery as the inspection target is a non-defective product in the non-defective product determination step S3, a capacity check step S4 is performed.

In the capacity check step S4, a battery capacity of the secondary battery is checked based on a current used in a charging process until a voltage of the secondary battery is increased to a voltage that ages the secondary battery. If the battery capacity checked in the capacity check step S4 falls within a standard value set in advance, a non-defective product determination step S5 of determining that the secondary battery is a non-defective product is performed. When it is determined that the secondary battery is a defective product in the non-defective product determination step S5, the inspection step is finished at that point. In the meantime, when it is determined that the secondary battery as the inspection target is a non-defective product in the non-defective product determination step S5, an aging step S6 is performed.

In the aging step S6, an aging process is performed on the secondary battery at a predetermined voltage. Further, in the aging step S6, a temperature control is performed so that a temperature difference between a plurality of secondary batteries falls within a temperature range set in advance. Here, it is preferable that the temperature range be set in a range from −3° C. to +3° C. relative to a reference temperature.

As described above, in the inspection method of the secondary battery according to First Embodiment, the low-temperature output characteristic inspection step S2 is performed before the aging step S6 is performed. The secondary battery has the following features. That is, when the secondary battery is subjected to the aging step S6, the secondary battery is activated so as to be usable. However, when the secondary battery is activated, its reaction resistance is decreased. That is, in the inspection method of the secondary battery according to First Embodiment, the capacity check step S4 is performed before the aging step S6, so that a large reaction resistance can be measured. In the following description, the low-temperature output characteristic inspection step S2, the measurement voltage of the charging step S1, the capacity check step S4, and the aging step S6 will be described more specifically.

Figure 2:
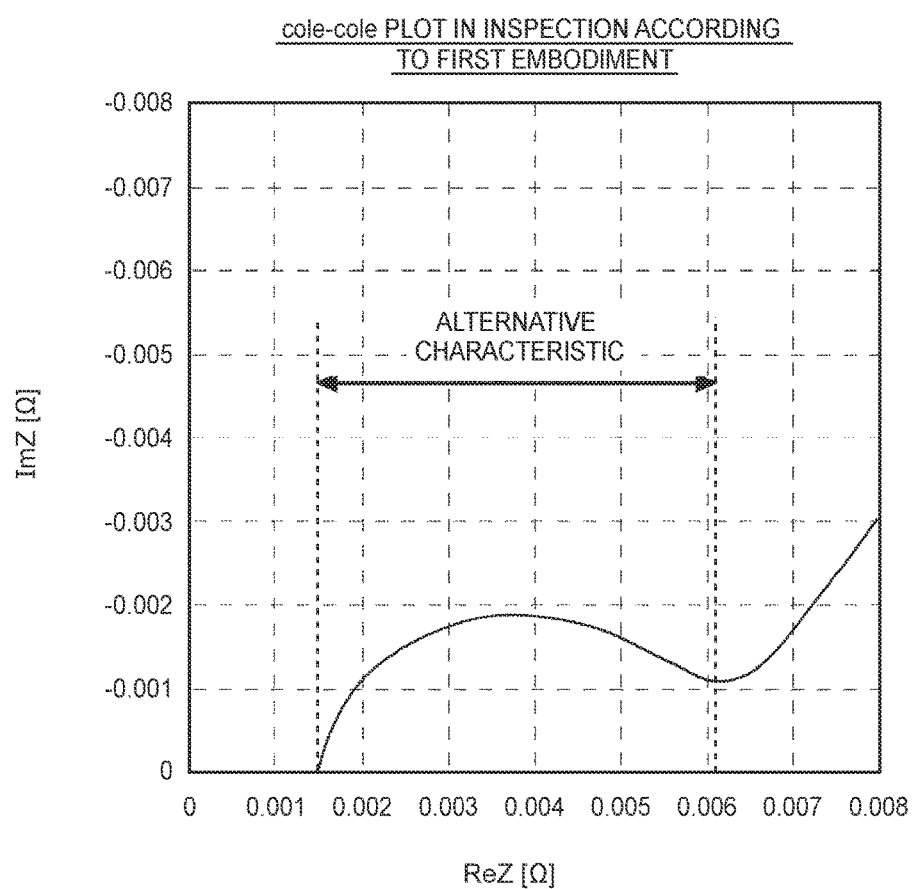
FIG. 2 is a graph showing a cole-cole plot of the secondary battery according to First Embodiment.

First, the low-temperature output characteristic inspection step S2 is described in detail. In view of this, FIG. 2 illustrates a graph showing a cole-cole plot of the secondary battery according to First Embodiment. The cole-cole plot is a complex impedance plane plot. When a measurement target includes a capacitor component, its plot draws a semicircle, and a point that cuts its real axis (a horizontal axis) corresponds to a reaction resistance of the secondary battery. In an example illustrated in FIG. 2, a plot draws a semicircle, which is not a perfect semicircle though. Resistance values between an initial point of the semicircle and a point where the semicircle is cut are hereinafter referred to as an alternative characteristic. Although details thereof will be described later, an alternative characteristic having a large value can be measured by performing the low-temperature output characteristic inspection step S2 before the aging step S6.

Figure 3:
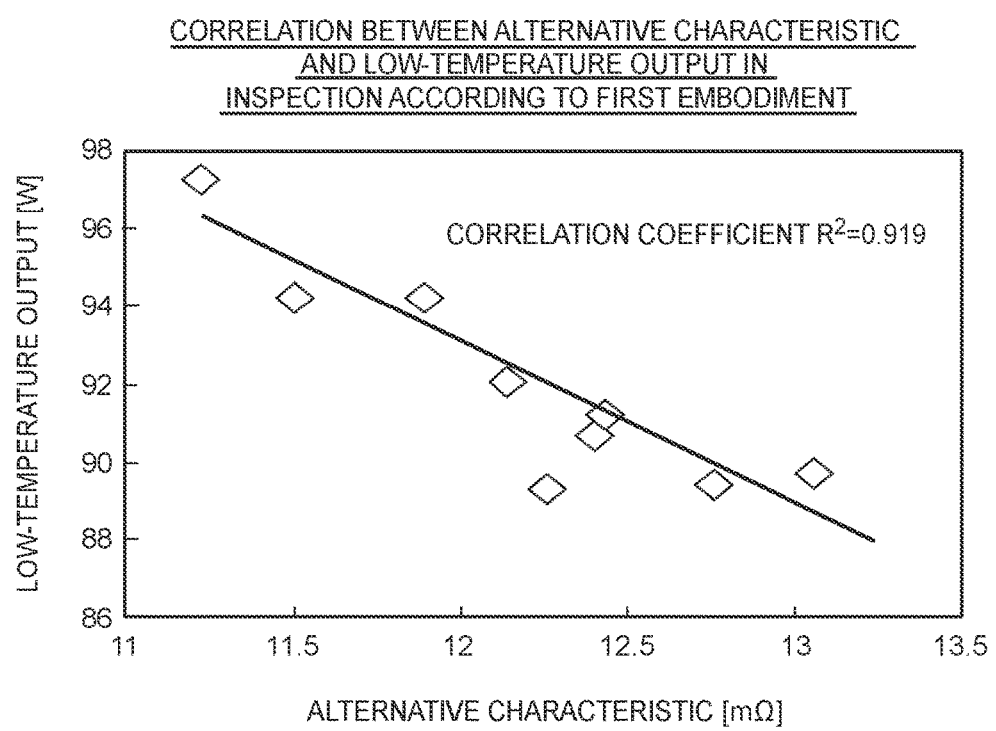
FIG. 3 is a graph to describe a correlation between an alternative characteristic and a low-temperature output in the inspection method of the secondary battery according to First Embodiment.

Further, the alternative characteristic has a correlation with a low-temperature output of the secondary battery. In view of this, FIG. 3 illustrates a graph to describe the correlation between the alternative characteristic and the low-temperature output in the inspection method of the secondary battery according to First Embodiment. As illustrated in FIG. 3, in the inspection method of the secondary battery according to First Embodiment, a correlation coefficient $R^2$ is 0.919, which is a high value.

Figure 4:
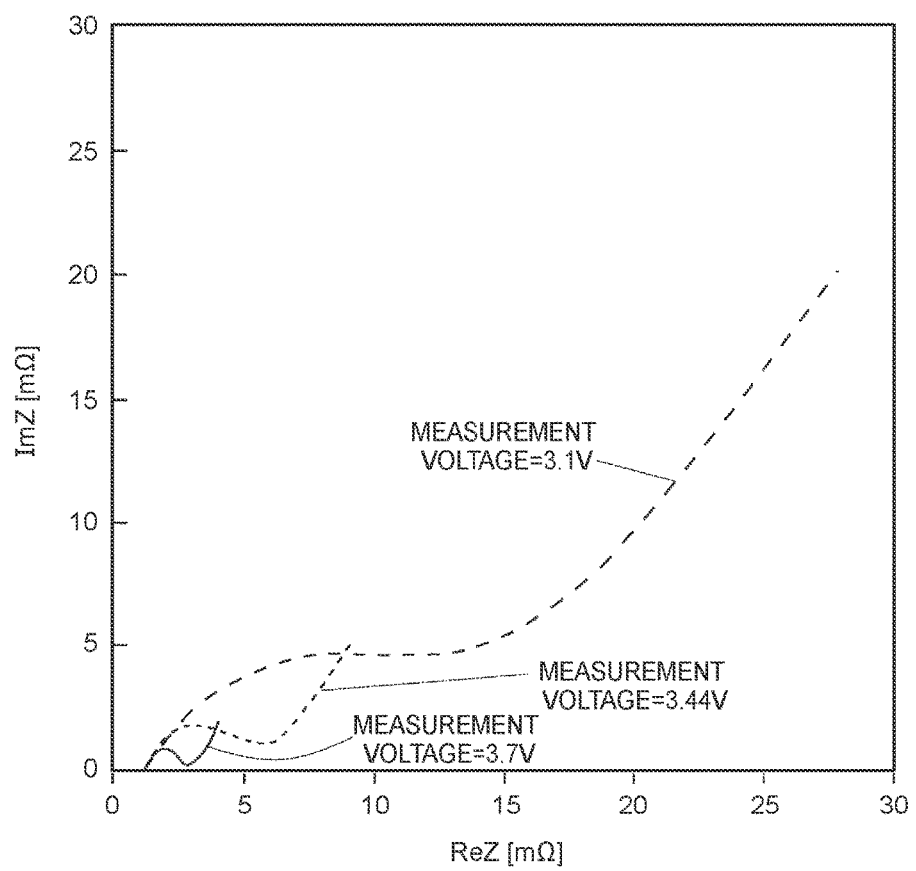
FIG. 4 is a graph showing variations in the cole-cole plot according to variations in a measurement voltage set in the secondary battery, in the inspection method of the secondary battery according to First Embodiment.

Next will be described the measurement voltage of the charging step S1. In the secondary battery, a magnitude of the alternative characteristic that can be measured largely varies depending on a magnitude of the measurement voltage. In view of this, FIG. 4 illustrates a graph showing variations in the cole-cole plot according to variations in the measurement voltage to be set in the secondary battery, in the inspection method of the secondary battery according to First Embodiment. As illustrated in FIG. 4, the semicircle of the cole-cole plot becomes larger as the measurement voltage is lower.

Figure 5:
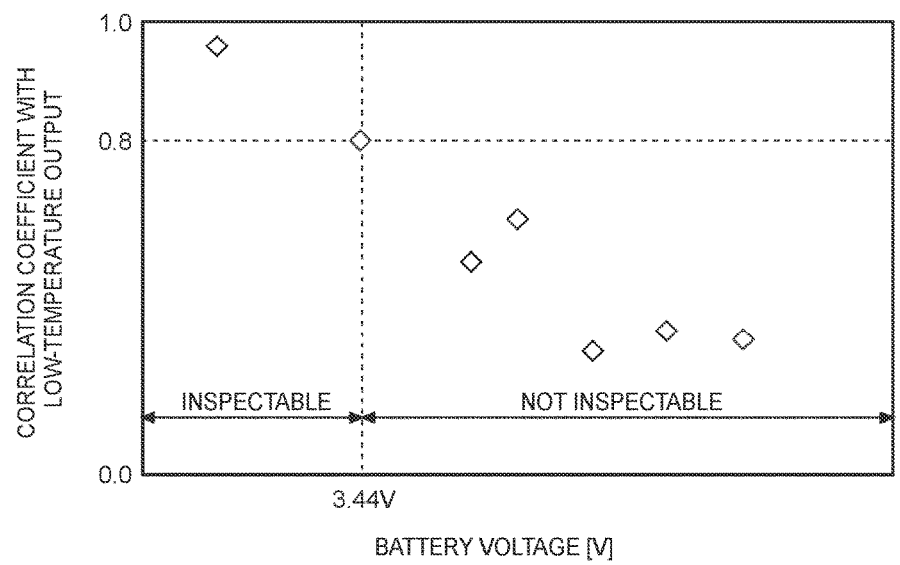
FIG. 5 is a graph to describe a relationship between a measurement voltage set in the secondary battery and a correlation coefficient with respect to a low-temperature output in the inspection method of the secondary battery according to First Embodiment.

Here, the following describes a relationship between the measurement voltage and the correlation coefficient $R^2$ described in FIG. 3. FIG. 5 illustrates a graph to describe a relationship between a measurement voltage to be set in the secondary battery and a correlation coefficient with respect to a low-temperature output in the inspection method of the secondary battery according to First Embodiment. In FIG. 5, a horizontal axis indicates a battery voltage at the time of the measurement, and a vertical axis indicates a correlation coefficient between an alternative characteristic and a low-temperature output obtained at each measurement voltage. As illustrated in FIG. 5, in order to obtain a correlation coefficient $R^2$ of 0.8 or more, a voltage of 3.44 V or less should be set as the measurement voltage. In view of this, in the inspection method of the secondary battery according to First Embodiment, if the measurement voltage is within a voltage range of 3.44 V or less, the measurement voltage is regarded as a measurement voltage that allows the inspection.

Figure 6:
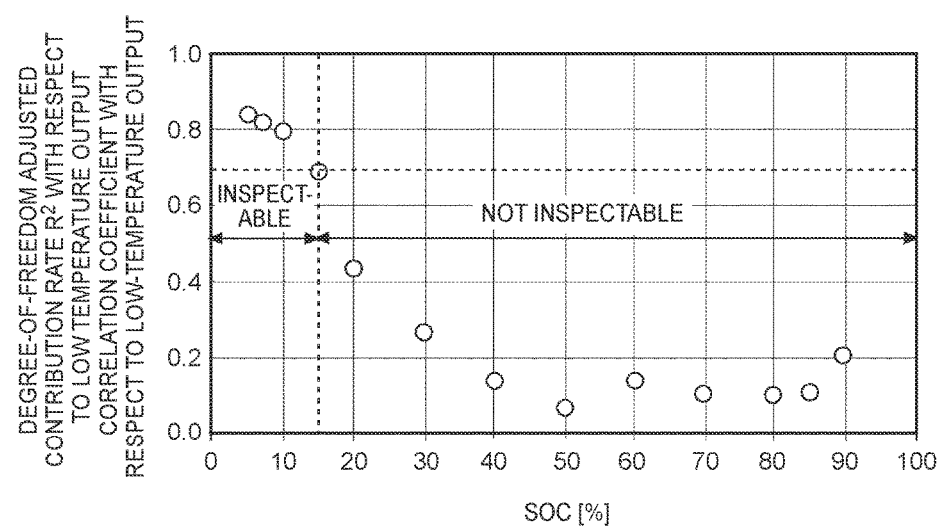
FIG. 6 is a graph to describe a relationship between a state of charge set in the secondary battery and a correlation coefficient with respect to a low-temperature output in the inspection method of the secondary battery according to First Embodiment.

As shown in FIG. 5, the measurement voltage can be set as an absolute voltage to be given to the secondary battery. However, the measurement voltage can be set from a state of charge (SOC) of the secondary battery. In view of this, FIG. 6 illustrates a graph to describe a relationship between the state of charge to be set in the secondary battery and a correlation coefficient (a degree-of-freedom adjusted contribution rate $R^2$) with respect to a low-temperature output in the inspection method of the secondary battery according to First Embodiment. As illustrated in FIG. 6, when the measurement voltage of the secondary battery is set to a voltage at which the SOC is less than 15% in a state where the secondary battery can be shipped, a value of 0.7 or more can be obtained as the correlation coefficient $R^2$. That is, in the inspection method of the secondary battery according to First Embodiment, a voltage corresponding to a voltage at which the SOC is less than 15% can be set as the measurement voltage.

Figure 7:
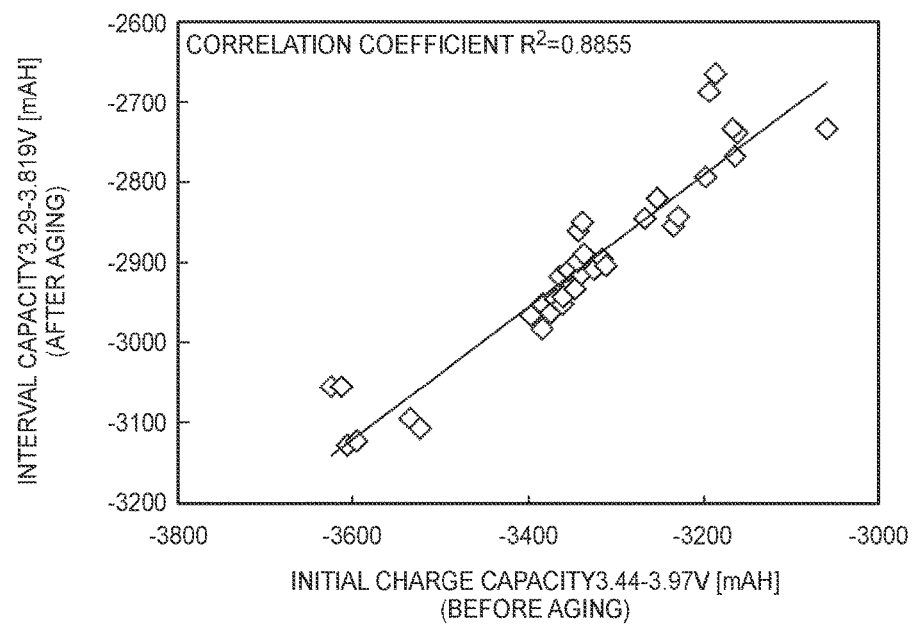
FIG. 7 is a graph to describe a relationship between an initial charge capacity and an interval capacity after aging in the inspection method of the secondary battery according to First Embodiment.

Next will be described the capacity check step S4 in detail. As described above, in the capacity check step S4, a battery capacity of the secondary battery is checked based on a current used in a charging process until the voltage is increased to a voltage that ages the secondary battery. In view of this, a graph to describe a relationship between a charge capacity (e.g., an initial charge capacity) that can be obtained in the capacity check step S4 performed before aging and an interval capacity after the aging is illustrated in FIG. 7. As illustrated in FIG. 7, a high correlation coefficient $R^2$ of 0.8855 can be obtained between an initial charge capacity (3.44 V to 3.97 V) obtained in the capacity check step S4 performed before the aging and an interval capacity (3.29 V to 3.819 V) measured after the aging. That is, in the inspection method of the secondary battery according to First Embodiment, a battery capacity after the aging can be estimated with high accuracy by performing calculation by use of the graph of FIG. 7 from the initial charge capacity thus obtained in the capacity check step S4.

Figure 8:
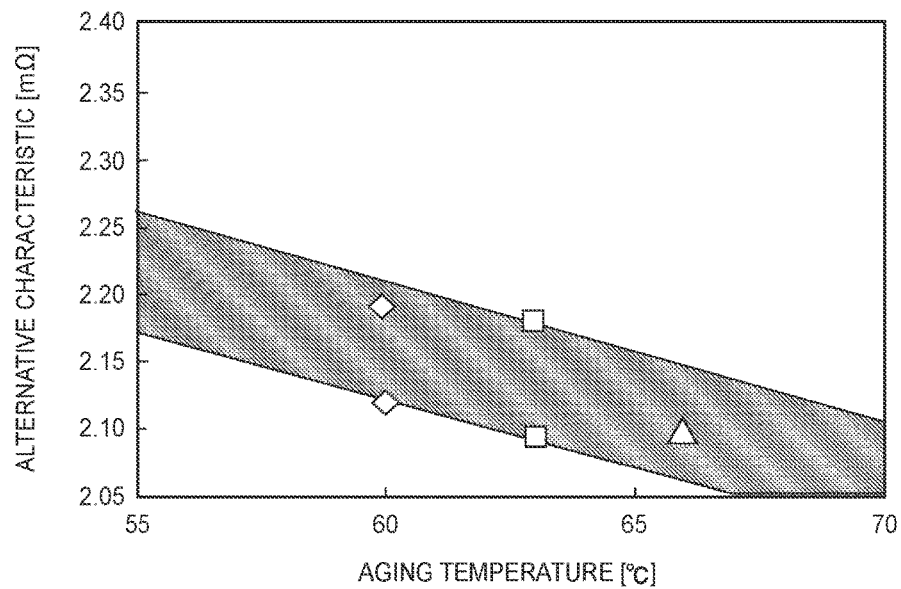
FIG. 8 is a graph to describe a relationship between an aging temperature and variations in an alternative characteristic in the inspection method of the secondary battery according to First Embodiment.

Next will be described the aging step S6. In the inspection method of the secondary battery according to First Embodiment, since the alternative characteristic is measured before the aging step S6, the alternative characteristic may vary depending on an aging temperature. In view of this, FIG. 8 illustrates a graph to describe a relationship between the aging temperature and variations in the alternative characteristic in the inspection method of the secondary battery according to First Embodiment. In FIG. 8, a range in which the alternative characteristic varies depending on the aging temperature is illustrated as a hatching area. As can be understood from FIG. 8, an alternative resistance varies depending on the aging temperature. In view of this, in the inspection method of the secondary battery according to First Embodiment, as the aging temperature, a range where the variations in the alternative characteristic fall within a range from −5 mΩ to +5 mΩ is regarded as a management range of the aging temperature. More specifically, in the inspection method of the secondary battery according to First Embodiment, 63° C. is set as a reference temperature, and a range from −3° C. to +3° C. relative to the reference temperature is regarded as the management range of the aging temperature.

Here, the following describes the inspection method of the secondary battery according to First Embodiment in comparison with a comparative example in which a capacity check inspection and a low-temperature output inspection are performed after aging. In view of this, a flowchart of an inspection method of a secondary battery according to the comparative example is illustrated in FIG. 9.

Figure 9:
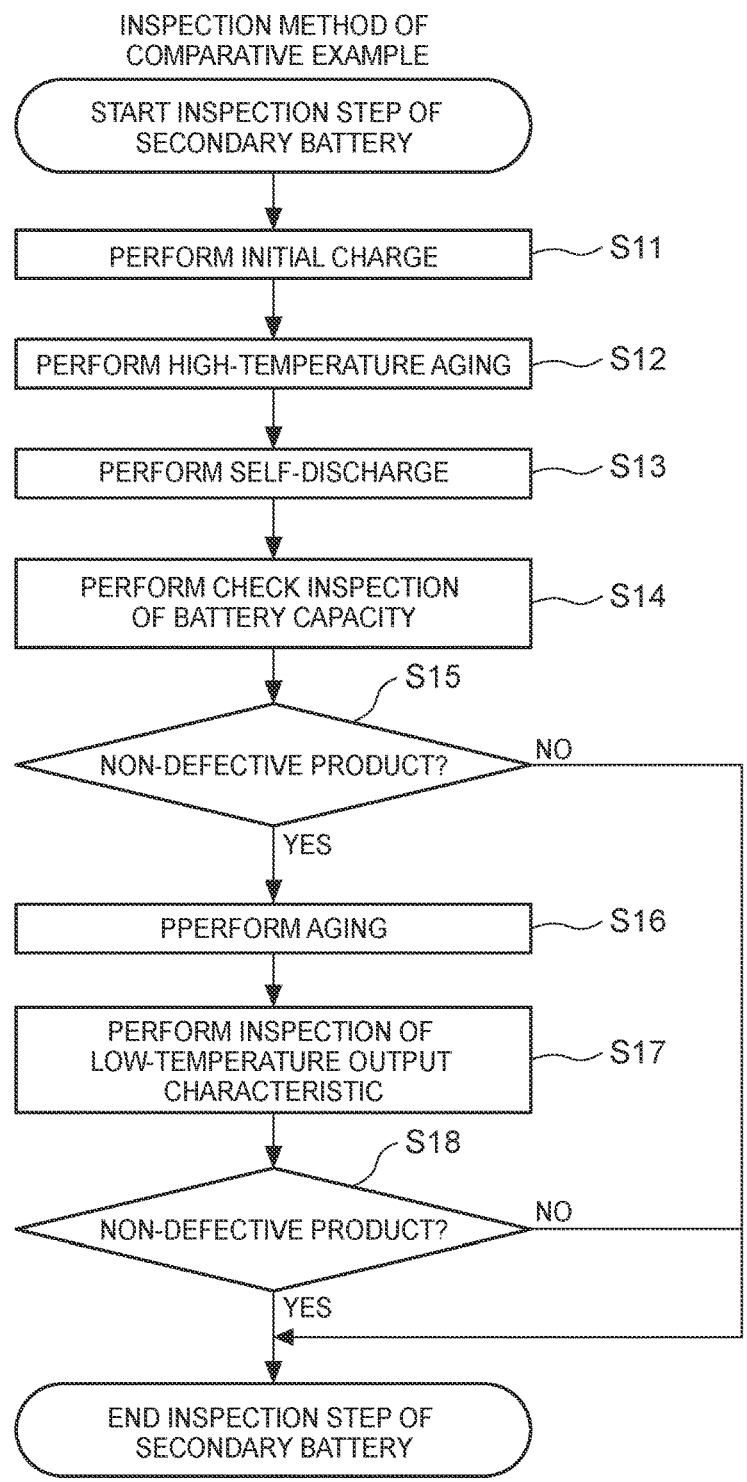
FIG. 9 is a flowchart of an inspection method of a secondary battery according to a comparative example.

As illustrated in FIG. 9, in the inspection method of the secondary battery according to the comparative example, an initial charge step S11 is performed first. In the initial charge step, the secondary battery is charged until a voltage of the secondary battery reaches a voltage of an aging process. Subsequently, a high-temperature aging step S12 is performed. The high-temperature aging step S12 is the same step as the aging step S6 described in FIG. 1. Subsequently, a self-discharge step S13 is performed. In the self-discharge step S13, the secondary battery is discharged in a state where the secondary battery is left as it is.

After that, in the inspection method of the secondary battery according to the comparative example, a capacity check step S14 is performed. In the capacity check step S14, the secondary battery is discharged at a constant current, so that a capacity check is performed on the secondary battery from a current value obtained at the time of the discharge. Subsequently, a non-defective product determination step S15 of determining whether or not the battery capacity obtained in the capacity check step S14 falls within a standard range is performed. When it is determined that the secondary battery is a defective product in the non-defective product determination step S15, the inspection step is finished. In the meantime, when it is determined that the secondary battery is a non-defective product in the non-defective product determination step S15, the voltage of the secondary battery is increased to a measurement voltage and then an aging step S16 is performed in the inspection method of the secondary battery according to the comparative example. After that, in the inspection method of the secondary battery according to the comparative example, a low-temperature output characteristic inspection step S17 is performed. The low-temperature output characteristic inspection step S17 is the same process as the low-temperature output characteristic inspection step S2 shown in FIG. 1. Then, a non-defective product determination step S18 of determining whether or not a voltage drop amount obtained in the low-temperature output characteristic inspection step S17 is a threshold or less is performed. When it is determined that the secondary battery as an inspection target is a defective product in the non-defective product determination step S18, the inspection step is finished by determining that the secondary battery is a defective product. In the meantime, when it is determined that the secondary battery as the inspection target is a non-defective product in the non-defective product determination step S18, it is determined that the secondary battery can be shipped, and the inspection step is finished.

Subsequently, the following describes a difference between the alternative characteristic that can be obtained in the low-temperature output characteristic inspection step S17 in the inspection method of the secondary battery according to the comparative example, and the alternative characteristic that can be obtained in the low-temperature output characteristic inspection step S2 in the inspection method of the secondary battery according to First Embodiment. In view of this, FIG. 10 is a view to compare the cole-cole plot of the secondary battery in the inspection method of the secondary battery according to First Embodiment, with a cole-cole plot of the secondary battery in the inspection method of the secondary battery according to the comparative example.

Figure 10:
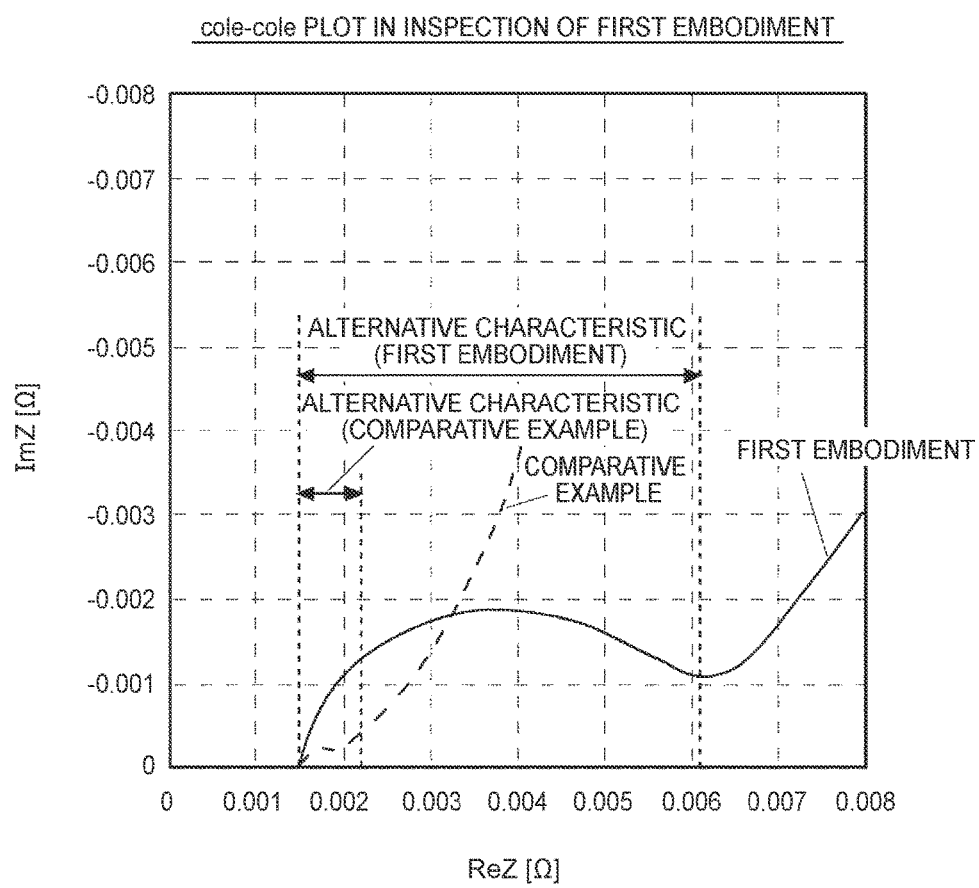
FIG. 10 is view to compare the cole-cole plot of the secondary battery in the inspection method of the secondary battery according to First Embodiment, with a cole-cole plot of the secondary battery in the inspection method of the secondary battery according to the comparative example.

As illustrated in FIG. 10, the alternative characteristic that can be obtained in the inspection method of the secondary battery according to the comparative example is markedly smaller than the alternative characteristic that can be obtained in the inspection method of the secondary battery according to First Embodiment. That is, in a case where the alternative characteristic is obtained after the aging process, only an alternative characteristic that is smaller than an alternative characteristic obtained before the aging process can be obtained.

Figure 11:
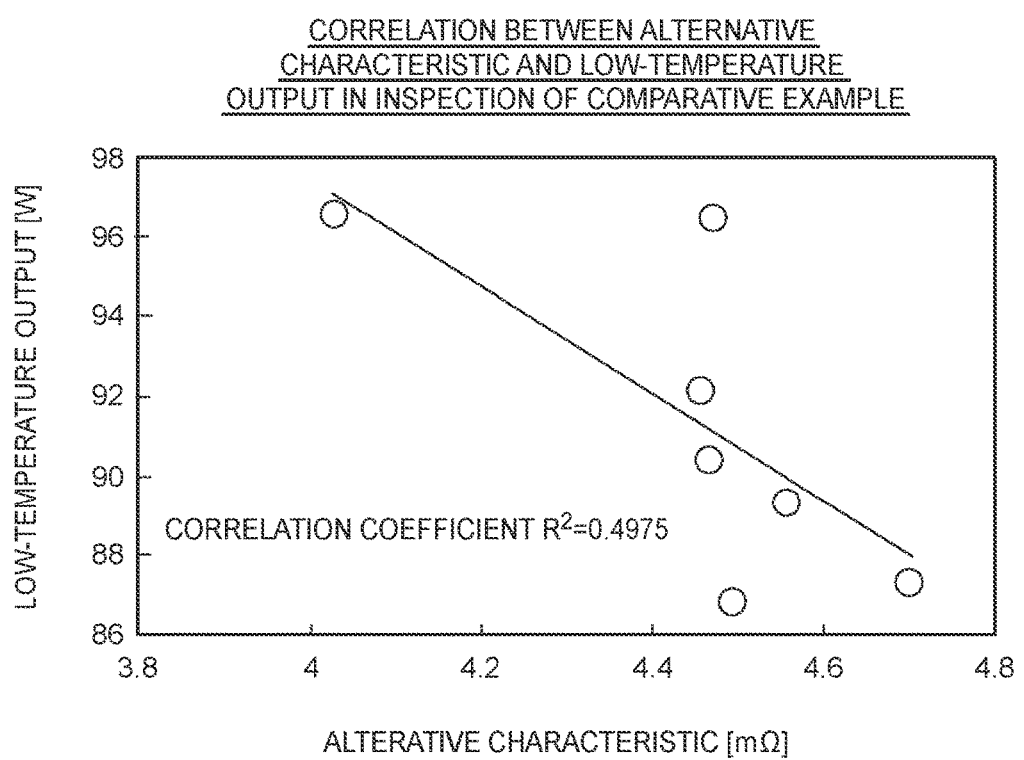
FIG. 11 is a graph to describe a correlation between an alternative characteristic and a low-temperature output in the inspection method of the secondary battery according to the comparative example.

Further, FIG. 11 illustrates a graph to describe a correlation between an alternative characteristic and a low-temperature output in the inspection method of the secondary battery according to the comparative example. As illustrated in FIG. 11, a correlation coefficient $R^2$ between the alternative characteristic and the low-temperature output in the inspection method of the secondary battery according to the comparative example is 0.4975, which is much smaller than the correlation coefficient $R^2$ that can be obtained in the inspection method of the secondary battery according to First Embodiment described in FIG. 3. From such a fact, it is found that the inspection method of the secondary battery according to First Embodiment has high measurement accuracy.

Figure 12:
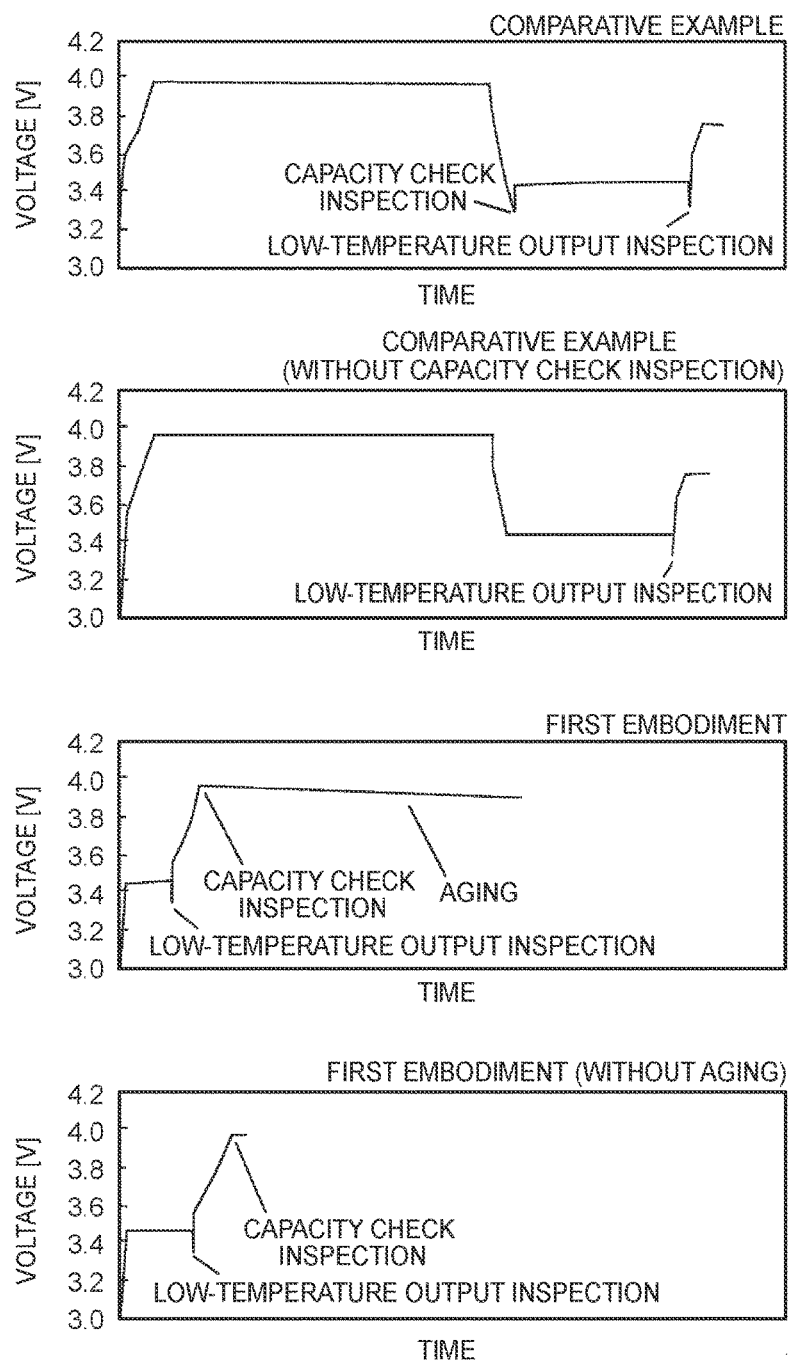
FIG. 12 is a graph showing a voltage change of the secondary battery in an inspection step so as to describe an inspection time in the inspection method of the secondary battery according to First Embodiment.

Subsequently, FIG. 12 illustrates a graph showing a voltage change of the secondary battery during an inspection step so as to describe an inspection time in the inspection method of the secondary battery according to First Embodiment. FIG. 12 also illustrates a voltage change of the secondary battery during an inspection step to which the inspection method of the secondary battery according to the comparative example is applied.

As illustrated in FIG. 12, in the inspection method of the secondary battery according to the comparative example, even if a capacity check inspection is omitted, an inspection time is hardly reduced. This is because the high-temperature aging step S12 and the aging step S16 take a long time. In the meantime, in the inspection method of the secondary battery according to First Embodiment, even if the low-temperature output characteristic inspection step S2 and the capacity check step S4 are performed and then the aging step S6 is further performed after that, the inspection can be completed with a shorter time than the inspection method of the secondary battery according to the comparative example. Further, in the inspection method of the secondary battery according to First Embodiment, it is possible to largely shorten the inspection time by omitting the aging step S6.

As described above, according to the inspection method of the secondary battery according to First Embodiment, the alternative characteristic of the secondary battery can be measured with high accuracy. Hereby, in the inspection method of the secondary battery according to First Embodiment, the low-temperature output characteristic can be inspected with high accuracy.

Further, in the inspection method of the secondary battery according to First Embodiment, a temperature difference between a plurality of secondary batteries is managed within a predetermined range in the aging step S6. This makes it possible to restrain variations in the alternative characteristic after the aging and variations in the low-temperature output characteristic. The temperature management is performable without adding facilities.

Further, in the inspection method of the secondary battery according to First Embodiment, it is possible to largely shorten the inspection time by reducing a time required for the aging and the like. Further, in the inspection method of the secondary battery according to First Embodiment, the capacity check step S4 does not require the discharge, so it is possible to reduce a discharge device to be used in the capacity check step.

Figure 13:
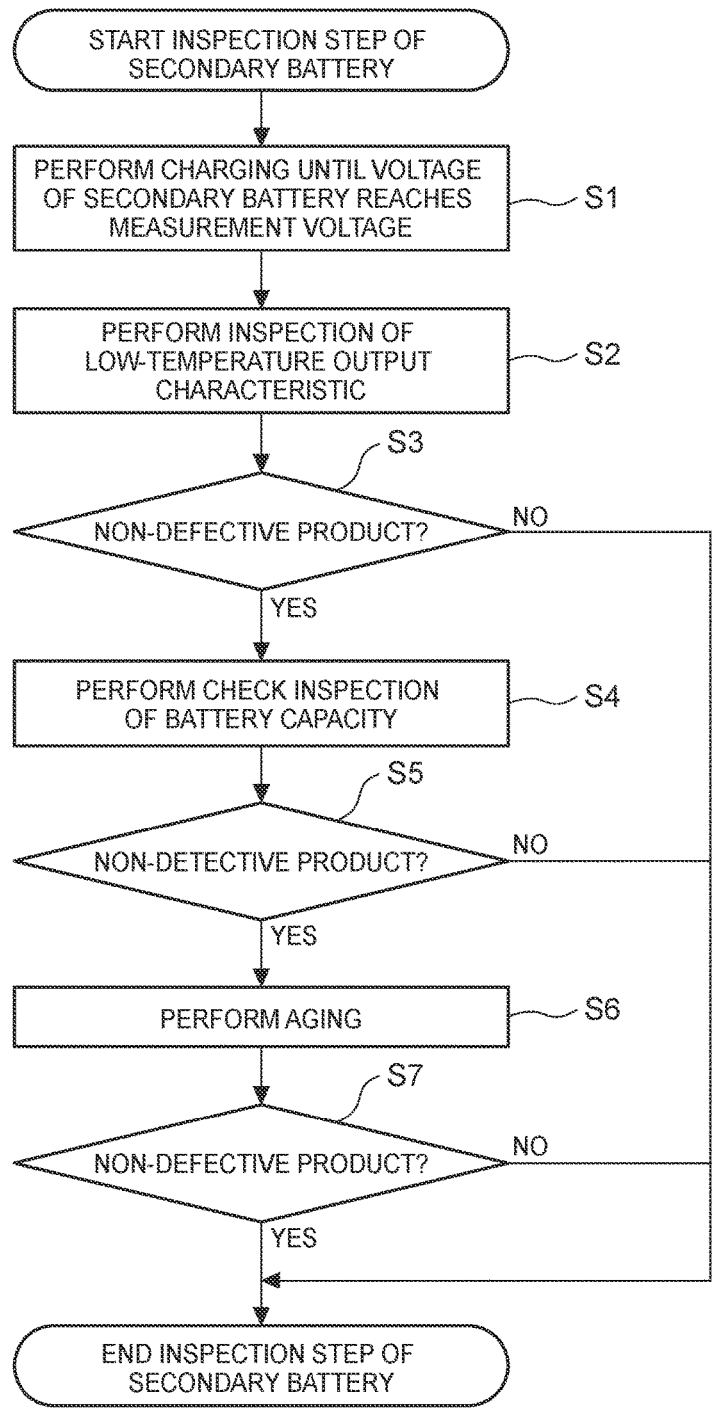
FIG. 13 is a flowchart of an inspection method of a secondary battery according to a modification.

The above description has been made specifically based on the embodiment of the invention made by the inventor. However, the present invention is not limited to the aforementioned embodiment, and needless to say, the present invention can be modified variously without departing from the gist of the present invention. For example, as illustrated in FIG. 13, a non-defective product determination step S7 may be performed after an aging step S6. In the non-defective product determination step S7, a low temperature output value is calculated by use of a prediction formula, so as to measure and guarantee a low-temperature output value with high accuracy without performing the temperature management.

In the non-defective product determination step S7, an inspection target value calculation step of calculating a value of an inspection target item (e.g., a low-temperature output value) of an inspection target cell is performed by substituting, into a prediction formula calculated in advance, an inspection value (e.g., a voltage drop amount calculated in step S2) and parameters (e.g., an aging temperature and an aging time) to be given to the inspection target cell during the aging step. In the non-defective product determination step S7, when a low-temperature output value calculated in the inspection target value calculation step falls within a standard range, it is determined that a secondary battery is a non-defective product. Further, in this modification, in the aging step S6, the aging temperature and the aging time that are parameters to be used in the after-mentioned non-defective product determination step are measured for each inspection target cell. Further, in the inspection method of the secondary battery according to the modification, a low-temperature output value is predicted based on the alternative characteristic calculated from the voltage drop amount calculated in step S2 and the aging temperature and the aging time of the inspection target cell during the aging step in step S6, thereby increasing inspection accuracy of the low-temperature output value.

Figure 14:
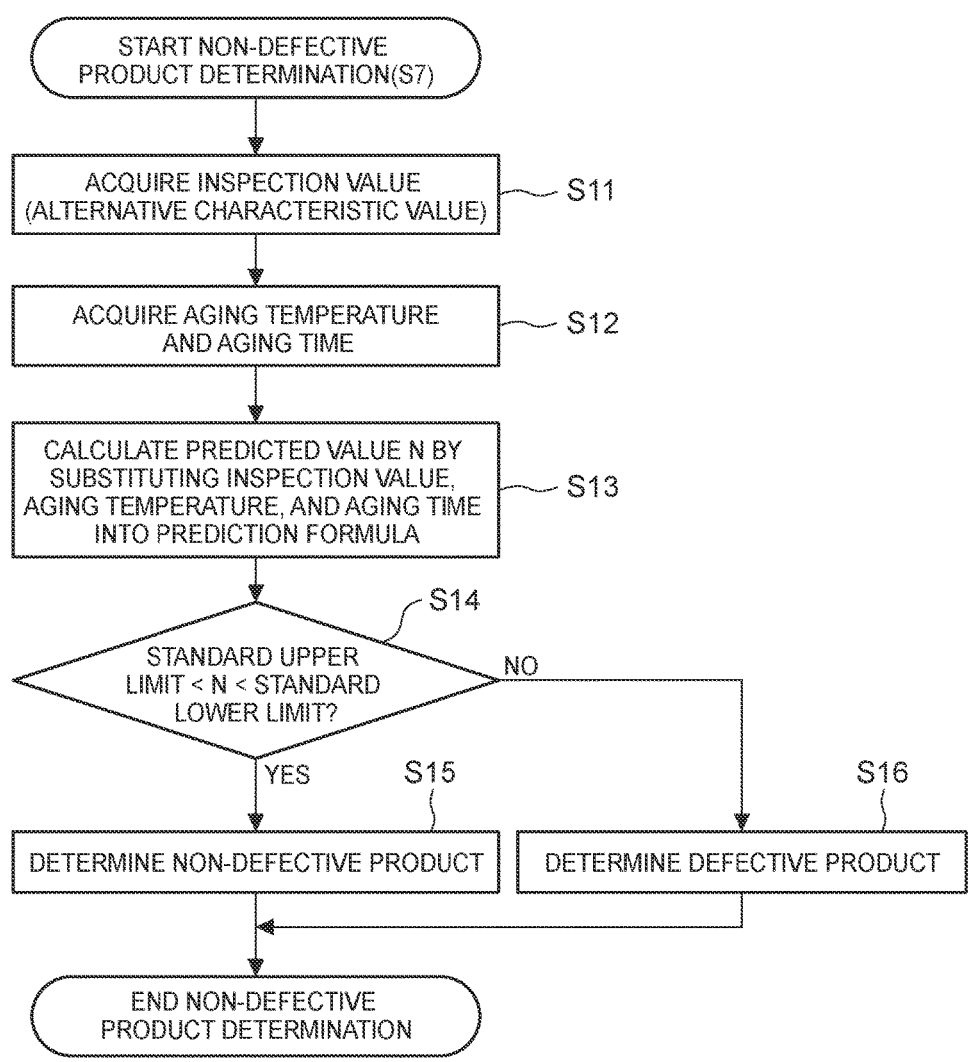
FIG. 14 is a flowchart to describe a non-defective product determination method performed after an aging step in the inspection method of the secondary battery according to the modification.

Next will be described the non-defective product determination step S7. FIG. 14 illustrates a flowchart to describe the non-defective product determination step S7 in the inspection method of the secondary battery according to the modification. As illustrated in FIG. 14, in the non-defective product determination step S7, the voltage drop amount calculated in step S2 is obtained first, so as to calculate an alternative characteristic value from the voltage drop amount (step S11). Note that, the alternative characteristic value is hereinafter referred to as an inspection value.

Subsequently, in the non-defective product determination step S7, the aging temperature and the aging time given to the inspection target cell in the aging step S6 are obtained (step S12). Then, the inspection value, the aging temperature, and the aging time are substituted into the prediction formula calculated in advance, so as to calculate a predicted value N (step S13). In the non-defective product determination step S7, it is determined whether or not the predicted value N thus calculated in step S13 falls within a standard range determined by a standard upper limit and a standard lower limit (step S14). If the predicted value N falls within the standard range in step S14, it is determined that the inspection target cell is a non-defective product (step S15). If the predicted value N is out of the standard range, it is determined that the inspection target cell is a defective product (step S16).

Now, the prediction formula is described below. In the inspection method of the secondary battery according to the modification, the prediction formula is calculated by performing a multiple regression analysis on a plurality of parameters that achieves a degree-of-freedom adjusted contribution rate $R^2$ of 0.8 or more. The prediction formula is calculated based on results obtained by performing steps S1 to S6 of the inspection step of the secondary battery of FIG. 13 in advance. In view of this, a flowchart to describe a calculation method of the prediction formula used in the inspection method of the secondary battery according to the modification is first illustrated in FIG. 15.

Figure 15:
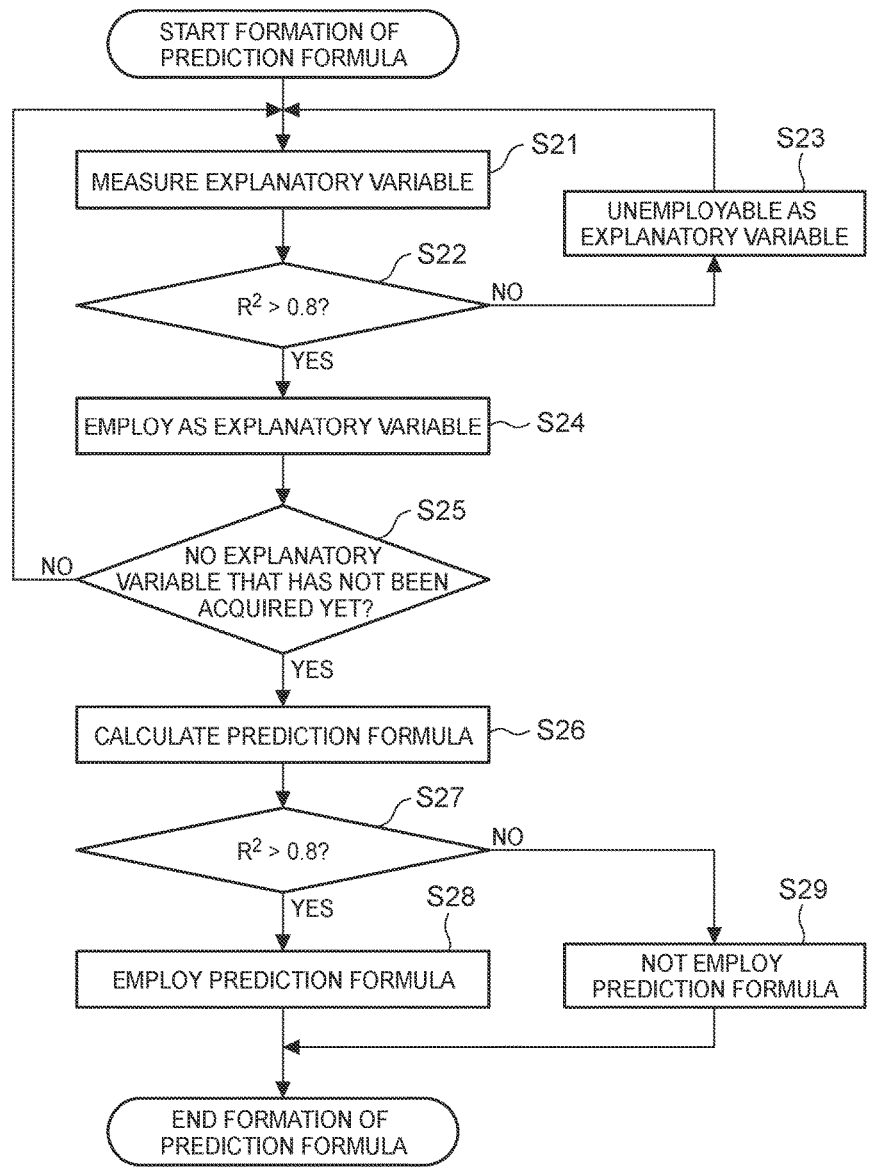
FIG. 15 is a flowchart to describe a formation method of a prediction formula in the inspection method of the secondary battery according to the modification.

As illustrated in FIG. 15, in the calculation of the prediction formula, an explanatory variable is measured first (step S21). In step S21, parameters having sensitivity to the low-temperature output characteristic, such as the alternative characteristic value, the aging temperature, and the aging time, are acquired from respective steps. It is first determined whether or not the degree-of-freedom adjusted contribution rate $R^2$ is larger than 0.8 in step S22, and then it is determined whether or not the explanatory variable acquired in step S21 should be targeted for a multiple regression analysis (steps S22 to S24). Evaluations on the explanatory variable in step S21 to S24 are performed on all parameters that may be employed as an explanatory variable (step S25).

Subsequently, a prediction formula is calculated by performing a multiple regression analysis on explanatory variables determined to be employable as the explanatory variable in step S22 and step S24 (step S26). Here, a formula that is obtained by generalizing an example of the prediction formula is shown in Formula (1).

$$\text{Predicted Value } N = A1 \times \text{Explanatory Variable } 1 + A2 \times \text{Explanatory Variable } 2 + \ldots + An \times \text{Explanatory Variable } n + a \quad (1)$$

As shown in Formula (1), the prediction formula is calculated as a formula obtained by adding an intercept a to a sum of products of coefficients A1 to An (n is an integer number) with their corresponding explanatory variables. Note that the coefficients A1 to An are each a gradient of a correlation linear line indicative of a relationship between each explanatory variable and an objective variable (e.g., a low-temperature output value) corresponding to a predicted value. Further, in the inspection method of the secondary battery according to the modification, the multiple regression analysis is performed by employing, as the explanatory variables, three values of an upper limit, a lower limit, and a median of the explanatory variable thus measured.

Subsequently, in the calculation of the prediction formula, each explanatory variable is substituted into the prediction formula thus calculated in step S26, so as to determine whether or not a degree-of-freedom adjusted contribution rate $R^2$ is larger than 0.8 (step S27). The degree-of-freedom adjusted contribution rate $R^2$ indicates a relationship between a predicted value N calculated by the prediction formula and a low-temperature output value of a measurement target cell that has been actually subjected to steps S1 to S6. In step S27, if it is confirmed that the degree-of-freedom adjusted contribution rate $R^2$ is larger than 0.8, the prediction formula thus calculated in step S26 is employed (step S28). In the meantime, in step S27, if it is determined that the degree-of-freedom adjusted contribution rate $R^2$ is smaller than 0.8, the prediction formula thus calculated in step S26 is not employed (step S29).

The prediction formula calculated according to a calculation procedure described in FIG. 15 will be described more specifically. In the inspection method of the secondary battery according to the modification, the alternative characteristic value, the aging temperature, and the aging time are used as the explanatory variables. Note that a temperature increase time and a temperature increase speed before the aging may be employed as the explanatory variables.

Figure 16:
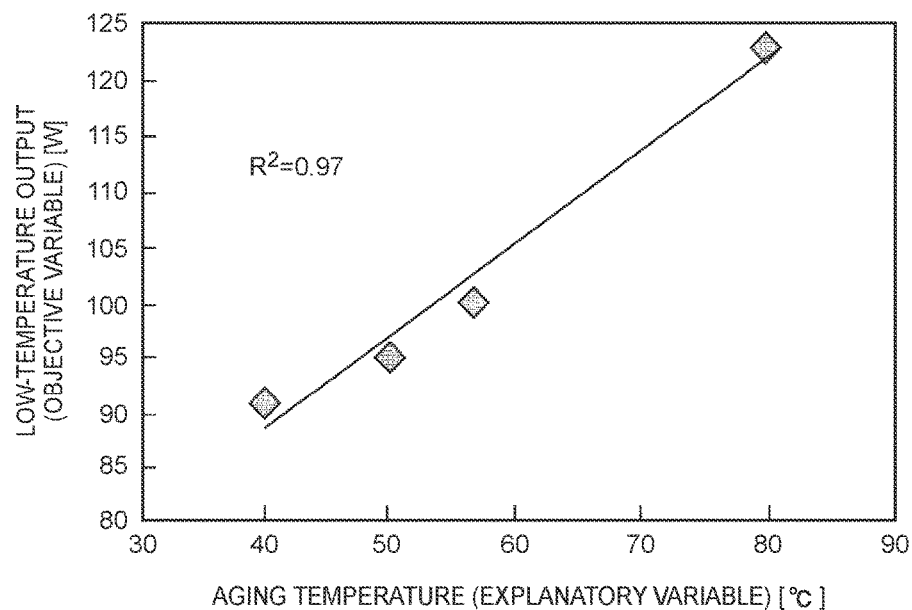
FIG. 16 is a graph to describe a relationship between an aging temperature and a low-temperature output in the inspection method of the secondary battery according to the modification.
Figure 17:
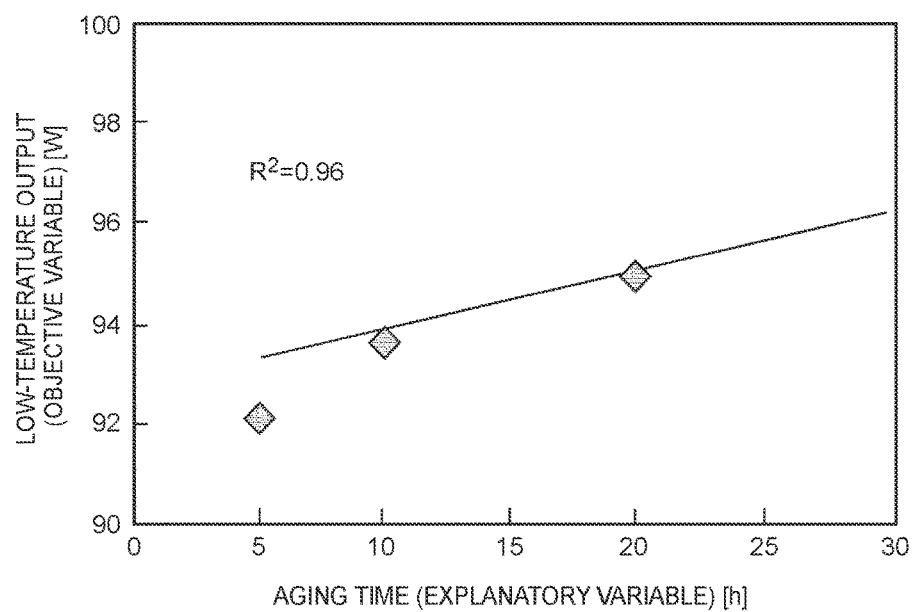
FIG. 17 is a graph to describe a relationship between an aging time and a low-temperature output in the inspection method of the secondary battery according to the modification.

The degree-of-freedom adjusted contribution rate $R^2$ of the alternative characteristic is larger than 0.919 and 0.8, as illustrated in FIG. 3. In view of this, degree-of-freedom adjusted contribution rates $R^2$ about the aging temperature and the aging time are described. FIG. 16 illustrates a graph to describe a relationship between the aging temperature and the low-temperature output in the inspection method of the secondary battery according to the modification. As illustrated in FIG. 16, there is such a relationship between the aging temperature and the low-temperature output value that the degree-of-freedom adjusted contribution rate $R^2$ is 0.97. Further, FIG. 17 illustrates a graph to describe a relationship between the aging time and the low-temperature output in the inspection method of the secondary battery according to the modification. As illustrated in FIG. 17, there is such a relationship between the aging time and the low-temperature output value that the degree-of-freedom adjusted contribution rate $R^2$ is 0.96. From such a fact, the alternative characteristic value, the aging temperature, and the aging time are employable as the explanatory variables in the inspection method of the secondary battery according to the modification.

Subsequently, the following describes a degree-of-freedom adjusted contribution rate $R^2$ of a predicted value N calculated by the prediction formula. Further, as a comparative example, a degree-of-freedom adjusted contribution rate $R^2$ between an alternative characteristic value and a low-temperature output value is also described.

Figure 18:
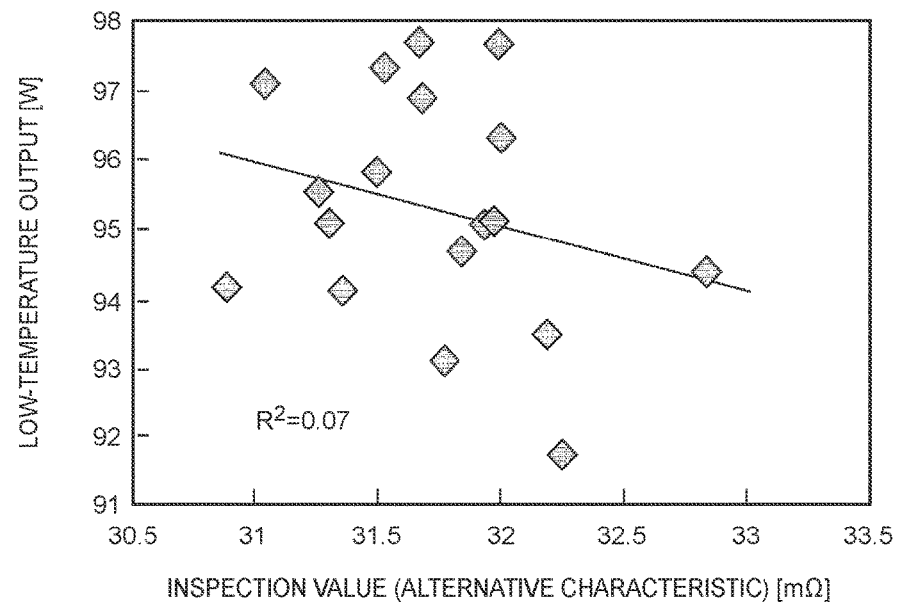
FIG. 18 is a graph to describe a relationship between an inspection value after the aging step and a low-temperature output characteristic in the inspection method of the secondary battery according to the modification.

Initially, FIG. 18 illustrates a graph to describe a relationship between an inspection value and a low-temperature output characteristic after the aging step in the inspection method of the secondary battery according to the modification. The example illustrated in FIG. 18 indicates a relationship between a measured low-temperature output value and a measured alternative characteristic value, both measured after the aging step S6 is performed on a measurement target cell. In the inspection method of the secondary battery according to the modification, a low-temperature output value of a finished inspection target cell varies depending on the aging temperature and the aging time of step S6 as described in FIG. 8. In FIG. 18, the following fact is found: even if a low-temperature output value is predicted only from an inspection value (e.g., an alternative characteristic value) calculated from a measured value, it is impossible to predict a low-temperature output value with higher accuracy due to the influence of variations caused in the aging step S6. In the example shown in FIG. 18, a degree-of-freedom adjusted contribution rate $R^2$ is 0.07, which is a very low value.

Figure 19:
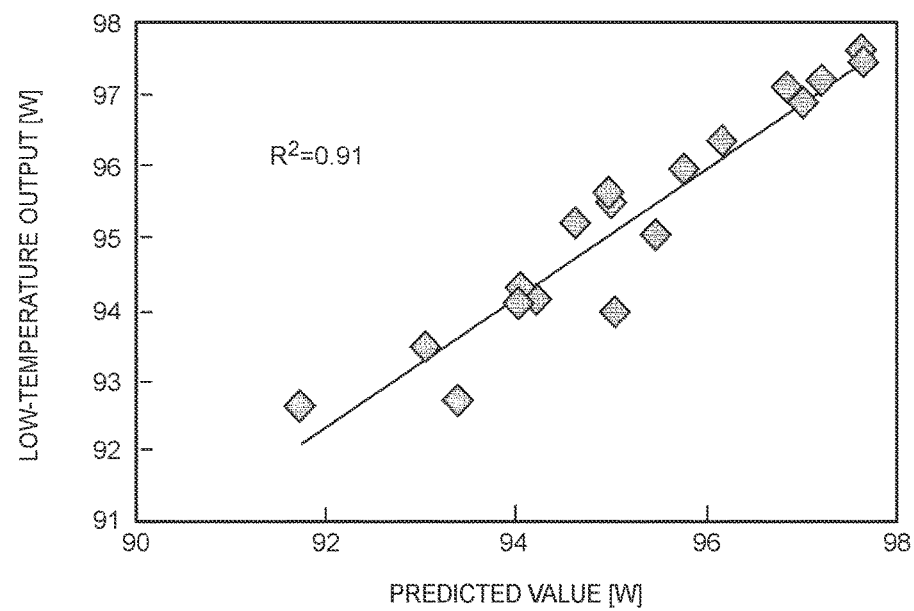
FIG. 19 is a graph to describe a relationship between a calculated predicted value and a low-temperature output characteristic in the inspection method of the secondary battery according to the modification.

Subsequently, FIG. 19 illustrates a graph to describe a relationship between a calculated inspection value and a low-temperature output characteristic in the inspection method of the secondary battery according to the modification. As illustrated in FIG. 19, the predicted value N calculated by substituting the alternative characteristic value, the aging temperature, and the aging time into the prediction formula calculated in step S26 has a high correlation with an actually measured low-temperature output value of the inspection target cell. In the example illustrated in FIG. 19, a degree-of-freedom adjusted contribution rate $R^2$ is 0.91, which is a good value.

As described above, according to the inspection method of the secondary battery according to the modification, the alternative characteristic of the secondary battery can be measured with high accuracy. The alternative characteristic has a high correlation with the low-temperature characteristic of the inspection target cell. Further, in the inspection method of the secondary battery according to the modification, a value of an inspection target item (e.g., a low-temperature output value) of the inspection target cell is calculated as the predicted value N from the prediction formula prepared in advance, by use of parameters during the aging in addition to the alternative characteristic value. The parameters have a large influence on the low-temperature output characteristic of the inspection target cell and also have a high correlation with the low-temperature output characteristic. Hereby, in the inspection method of the secondary battery according to the modification, the low-temperature output characteristic can be inspected with high accuracy. In the modification, a value of the inspection target item is calculated by substituting, into the prediction formula, a voltage drop amount obtained from the measurement of the inspection target cell and parameters given to the inspection target cell during the aging step. Further, in the inspection method of the secondary battery according to the present invention, the non-defective product determination on the inspection target cell is performed based on the calculated value of the inspection target item. Hereby, in the modification, it is possible to improve the measurement accuracy of the low-temperature output inspection. More specifically, according to the inspection method of the secondary battery according to the present invention, since the non-defective product determination is performed based on the value of the inspection target item for which variations of battery performance due to the aging are predicted, it is possible to restrain a decrease in the correlation between the voltage drop amount thus measured and the low-temperature output.

Further, in the inspection method of the secondary battery according to the modification, it is possible to predict and guarantee the low-temperature output value of the inspection target cell after the aging without managing a temperature difference between a plurality of secondary batteries within a predetermined range in the aging step S6. In view of this, the inspection method of the secondary battery according to the modification is performable without adding facilities necessary for the temperature management.

Further, the inspection method of the secondary battery according to the modification does not require the discharge in the capacity check step S4, so it is possible to reduce a discharge device to be used in the capacity check step.

What is claimed is:

1. An inspection method of a secondary battery, comprising:
   a charging step of charging an inspection target cell to a predetermined voltage;
   a voltage drop amount calculation step of calculating an amount of a voltage drop due to discharge by discharging the inspection target cell at a voltage of not more than the predetermined voltage;
   a non-defective product determination step of determining that the inspection target cell is a non-defective product, in response to the voltage drop amount being equal to or less than a threshold;
   in response to a determination that the secondary battery is a defective product, termination of the non-defective determination step; and
   in response to and after the non-defective product determination step is performed and in response to a determination that the secondary battery is a non-defective product, a voltage of the second battery is increased to a measurement voltage and an aging step of the secondary battery is performed.

2. The inspection method according to claim 1, further comprising:
   an inspection target value calculation step of calculating a value of an inspection target item of the inspection target cell, the value being obtained by performing a multiple regression analysis by use of the voltage drop amount and at least one of an aging temperature and an aging time,
   wherein, in the non-defective product determination step, it is determined that the inspection target cell is the non-defective product when the calculated value of the inspection target item falls within a standard range.

3. The inspection method according to claim 1, wherein:
   the predetermined voltage is determined based on a voltage of the secondary battery at which a correlation coefficient between a low-temperature output of the secondary battery and the voltage drop amount is 0.8 or more, or a state of charge of the secondary battery at which the correlation coefficient between the low-temperature output of the secondary battery and the voltage drop amount is 0.7 or more.

4. The inspection method according to claim 1, wherein in the aging step, a temperature control is performed so that a temperature difference between a plurality of inspection target cells falls within a temperature range set in advance.

5. The inspection method according to claim 4, wherein the temperature range is set within a range from −3° C. to +3° C. relative to a reference temperature.

6. The inspection method according to claim 1, further comprising:
a capacity check step of checking a capacity of the secondary battery performed between the non-defective product determination step and the aging step.

\* \* \* \* \*